United States Patent [19]

Glaeser et al.

[11] 4,379,020

[45] Apr. 5, 1983

[54] POLYCRYSTALLINE SEMICONDUCTOR PROCESSING

[75] Inventors: Andreas M. Glaeser, Scituate; John S. Haggerty, Lincoln; Stephen C. Danforth, Winchester, all of Mass.

[73] Assignee: Massachusetts Institute of Technology, Cambridge, Mass.

[21] Appl. No.: 311,850

[22] Filed: Oct. 16, 1981

Related U.S. Application Data

[63] Continuation of Ser. No. 159,734, Jun. 16, 1980, abandoned.

[51] Int. Cl.³ .............................................. C30B 1/10
[52] U.S. Cl. .......................... 156/603; 156/DIG. 88; 156/605; 136/258; 423/348
[58] Field of Search ............... 156/603, 605, 613, 614, 156/612, DIG. 80, DIG. 88; 427/74–76, 86, 95; 29/572; 148/174; 118/722; 136/258; 423/348, 349

[56] References Cited

U.S. PATENT DOCUMENTS

| | | | |
|---|---|---|---|
| 3,341,361 | 9/1967 | Gorski | 156/DIG. 88 |
| 3,585,088 | 6/1971 | Schwuttke et al. | 156/603 |
| 4,003,770 | 1/1977 | Janowiecki et al. | 148/174 |
| 4,046,618 | 9/1977 | Chaudhari et al. | 156/603 |
| 4,059,461 | 11/1977 | Fan et al. | 156/DIG. 80 |
| 4,113,531 | 9/1978 | Zanio et al. | 148/174 |
| 4,152,535 | 5/1979 | Deminet et al. | 136/258 |
| 4,196,041 | 4/1980 | Baghdadi et al. | 156/DIG. 88 |
| 4,198,246 | 4/1980 | Wu | 427/35 |

OTHER PUBLICATIONS

Fan et al., "Crystallization of Amorphous Si Films", published in Applied Phys. Letts., vol. 27, Aug. 15, 1975, pp. 224–226.

*Primary Examiner*—Hiram H. Bernstein
*Attorney, Agent, or Firm*—Arthur A. Smith, Jr.; G. Eugene Dacey

[57] ABSTRACT

A process for forming large-grain polycrystalline films from amorphous films for use as photovoltaic devices. The process operates on the amorphous film and uses the driving force inherent to the transition from the amorphous state to the crystalline state as the force which drives the grain growth process. The resultant polycrystalline film is characterized by a grain size that is greater than the thickness of the film.

A thin amorphous film is deposited on a substrate. The formation of a plurality of crystalline embryos is induced in the amorphous film at predetermined spaced apart locations and nucleation is inhibited elsewhere in the film. The crystalline embryos are caused to grow in the amorphous film, without further nucleation occurring in the film, until the growth of the embryos is halted by impingement on adjacently growing embryos. The process is applicable to both batch and continuous processing techniques. In either type of process, the thin amorphous film is sequentially doped with p and n type dopants. Doping is effected either before or after the formation and growth of the crystalline embryos in the amorphous film, or during a continuously proceeding crystallization step.

12 Claims, 10 Drawing Figures

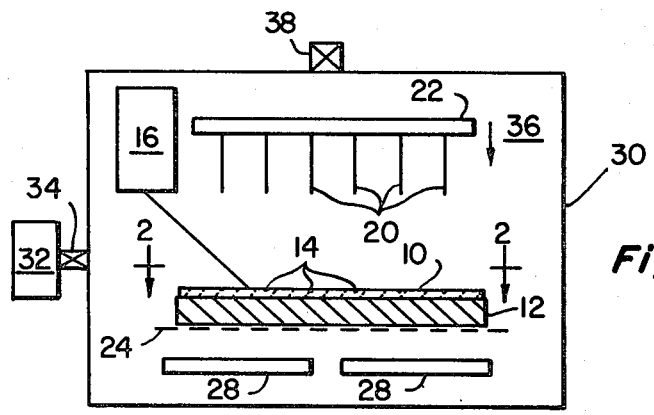
Fig. 1
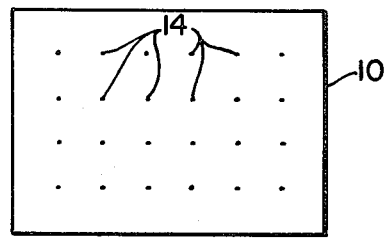
Fig. 2
Fig. 3
Fig. 4

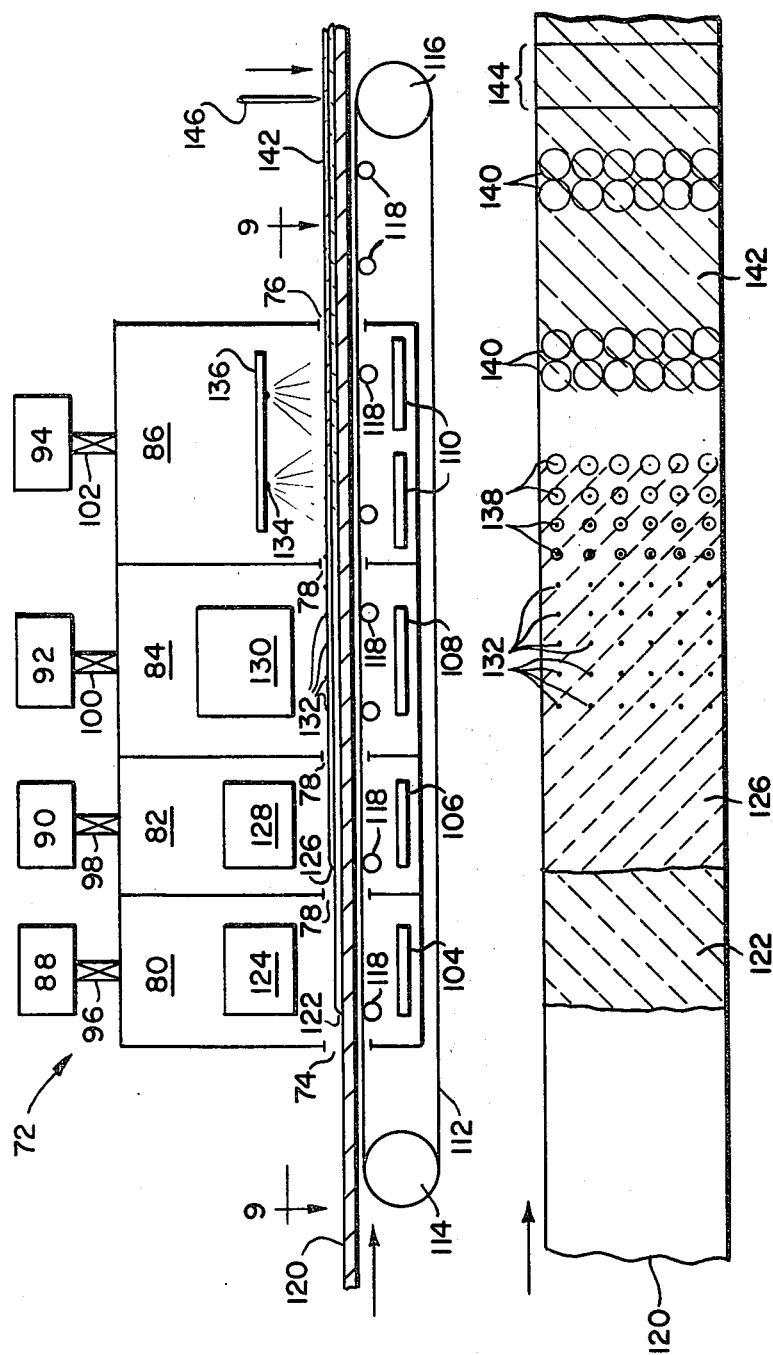

POLYCRYSTALLINE SEMICONDUCTOR PROCESSING

The Government has rights in this invention pursuant to Contract Number DE-FC02-79ET00081 awarded by the U.S. Department of Energy.

This is a continuation of application Ser. No. 159,734, filed on June 16, 1980, now abandoned.

BACKGROUND OF THE INVENTION

1. Field of the Invention

The present invention relates to polycrystalline semiconductor processing and, more particularly, is directed towards a method for forming thin large-grain polycrystalline films from amorphous films for use as generally large-grain solid state devices where crystallographic orientation is not important, such as, for example, photovoltaic devices. The resultant polycrystalline film is characterized by a grain size that is greater than the thickness of the film.

2. The Prior Art

Typically, thin large-grain polycrystalline films are conventionally grown in suitable furnaces by long, high temperature annealing cycles of thin small-grain polycrystalline films. In these processes, the driving force for grain growth is the reduction in grain boundary surface energy per unit volume with increased grain size. This driving force decreases inversely with grain size but becomes even smaller once the grain size approaches or exceeds the thickness of the film. Furthermore, at this stage of grain growth, grain boundary velocity and/or mobility also decrease due to interactions between the grain boundaries and the surface of the film. The lowered driving force for grain growth and the reduced grain boundary velocity and/or mobility combine to set an effective limit on the ultimate achievable grain size and that is approximately equal to the thickness of the film. Further grain growth occurs only with excessively long annealing times at very high temperatures, which require prohibitively high energy consumption levels, a procedure that can also introduce junction diffusion and contamination from the substrate or at the surface.

Another present day method for improving the crystallinity of semiconductor films involves the use of a laser beam matched to the film. By scanning the surface of the film, the matched beam delivers sufficient energy thereto to create a melt in the film and crystallization occurs by propagating the melt in the film along the scan track. U.S. Pat. No. 4,059,461. A further present day method also converts a small-grain polycrystalline film into large-grain polycrystalline or single-crystal film by crystallizing from a localized melt. U.S. Pat. No. 4,152,535. A still further method heats a substrate by direct current passsage in a vapor-phase deposition process in which 80 to 100% of the deposited film is subsequently melted from the free surface downward and resolidified from the substrate body upward. U.S. Pat. No. 4,113,532.

These present day methods of melting and reforming small-grain polycrystalline or amorphous films into single-crystal or large-grain polycrystalline films are economically handicapped, and remain so handicapped, because of the low values for maximum grain growth rates which are intrinsic to such growth processes, high energy investment and/or excessive contamination especially for processes which create melts.

SUMMARY OF THE INVENTION

It is, therefore, a principal object of the present invention to overcome the above shortcomings by providing a process for forming large-grain polycrystalline films from amorphous films, in which process the nucleation step is separated from the grain-growth step, rendering both steps controllable.

More specifically, it is an object of the present invention to provide a process for forming large-grain polycrystalline films from amorphous films that operates on the amorphous film and uses the driving force inherent in the transition from the amorphous to the crystalline state as the force to drive the grain growth in a controlled grain-growth step, following a controlled nucleation step.

Briefly, the process of the invention includes the steps of depositing a thin amorphous film on a substrate, inducing the formation of crystalline embryos at predetermined spaced apart locations in the amorphous film and inhibiting nucleation from occurring elsewhere in the film, and causing the crystalline embryos to grow, without further nucleation occurring in the film, until the growth of the embryos is halted by impingement on adjacently growing embryos. The resultant polycrystalline film is characterized by a grain size that is greater than the thickness of the film. The grain size itself is determined by the distances separating the predetermined spaced apart locations where the formation of the crystalline embryos is induced in the amorphous film.

Other objects of the present invention will in part be obvious and will in part appear hereinafter.

The invention accordingly comprises the process of the present disclosure, the scope of which will be indicated in the appended claims.

BRIEF DESCRIPTION OF THE DRAWINGS

For a fuller understanding of the nature and objects of the present invention, reference is made to the following detailed description, which is to be taken in connection with the accompanying drawings, wherein:

FIG. 1 is a schematic illustration of one embodiment of an apparatus suitable for forming large-grain polycrystalline films from amorphous films according to the process of the invention;

FIG. 2 is a plan view along the lines of 2—2 of FIG. 1;

FIG. 3 is a cross-sectional view, on an enlarged scale, of a portion of an amorphous film on a substrate;

FIG. 4 is a view similar to that shown in FIG. 3 but showing a portion of a resultant polycrystalline film on the substrate;

FIG. 8 is a schematic illustration of a fourth embodiment of an apparatus suitable for forming doped large-grain polycrystalline films from amorphous films in a continuous process, also according to the process of the invention;

FIG. 9 is a plan view along the lines of 9—9 of FIG. 8; and

FIG. 10 is a block diagram illustrating the steps of the process of the invention for forming large-grain polycrystalline films from amorphous films for use as photovoltaic devices.

DETAILED DESCRIPTION OF PREFERRED EMBODIMENTS

Figure 5:
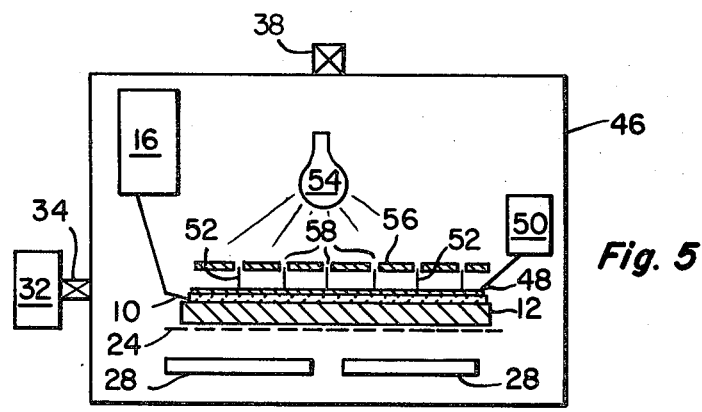
FIG. 5 is a schematic illustration of a second embodiment of an apparatus suitable for forming large-grain polycrystalline films from amorphous films, also according to the process of the invention.

Generally, the illustrated process relates to forming large-grain polycrystalline films from thin amorphous films for use as solid state devices, such as photovoltaic devices. A photovoltaic device or solar cell is a p-n junction device which converts the radiant energy of sunlight directly into electrical energy by means of the photovoltaic effect. The excessively high cost of presently available photovoltaic devices based on single crystal wafers is the inhibiting factor to their widespread terrestrial application. This high cost is a result of the stringent manufacturing requirements for high purity, essentially defect-free single crystal wafers needed for photovoltaics having an acceptable conversion efficiency in excess of ten percent. The invention addresses this problem by providing a process that combines a high deposition rate and the low costs of amorphous films with the high efficiencies and durabilities of the resultant polycrystalline films.

The process of the invention operates on a thin amorphous film 10 and uses the driving force inherent in the transition of the film 10 from the amorphous to the crystalline state as the force to drive the grain growth, following the controlled nucleation step. The thin amorphous film 10 can comprise any material suitable for photovoltaic applications and amendable to controlled nucleation and controlled crystallization according to the illustrated process. Such materials for forming the thin amorphous film 10 include gallium arsenide (GaAs), germanium (Ge), silicon (Si), cadmium telluride (CdTe), boron (B), and the like.

The process essentially comprises the steps of depositing the thin amorphous film 10 on a substrate 12, inducing the formation of a plurality of crystalline embryos at a plurality of localized surface treatment points 14 in the film 10 and inhibiting spontaneous nucleation from occurring anywhere else in the film 10, and causing the crystalline embryos to grow, again without further nucleation occurring in the film 10, until further grain growth of the embryos is halted by their impingement on adjacently growing embryos. The process can be practiced in any apparatus suitable for forming large-grain polycrystalline films from amorphous films according to the invention. Four embodiments of such a suitable apparatus are schematically illustrated herein and doubtless many others will readily suggest themselves to those skilled in the art. The first three of these embodiments relate to batch processing and the fourth embodiment relates to continuous processing.

As shown in FIG. 1, the thin amorphous film 10 is deposited on the substrate 12 from a source 16. The deposition of the amorphous film 10 can be achieved by any known technique, including radio-frequency (RF) sputtering, RF glow discharge, chemical vapor deposition, laser pyrolysis or the like. The particular thickness of the deposit to form the amorphous film 10 depends upon the particular material used to form the film 10. For example for a photovoltaic device, when working with gallium arsenide (GaAs), the thickness of the deposited amorphous film 10 is preferably about two microns; for silicon (Si), however, the thickness of the deposited film 10 is preferably between about thirty to about fifty microns. If the thickness of the resultant polycrystalline film, following the completion of the processing according to the invention as hereinafter described, is not sufficient for photovoltaic application, then the thickness will be augmented by well-known epitaxial growth techniques. The thickness of the substrate 12 is not critical and varies from about one tenth of a millimeter to about a centimeter or more, depending on final use and application for the resultant device. The material for forming the substrate 12 is selected according to the following criteria: (a) the material is to have a melting point above the processing temperatures involved in the nucleation and the subsequent grain-growth steps; (b) the material is not to react adversely with the deposited amorphous film 10; (c) the material is to have a thermal expansion coefficient that is close to that of the film 10; (d) the material is to provide the appropriate electrical conductivity for the resultant photovoltaic device; and (e) the material is to have sufficient thermal shock resistance so as not to be adversely affected either during the nucleation step or the following grain-growth step. The substrate 12 is, furthermore, preferably formed with a smooth upper surface 18.

The material forming the substrate 12 must thus be compatible with the material forming the thin amorphous film 10 deposited on its smooth upper surface 18. The following matches between film 10 and substrate 12 are considered compatible: 1. a substrate 12 formed of glassy carbon is appropriate for each of the following amorphous film 10 materials: GaAs, Ge, Si, CdTe and B; and 2. a substrate 12 formed of either fused silica, or sapphire, or β silicon carbide is appropriate for amorphous film 10 formed of silicon.

The function of the localized surface treatment points 14 in the amorphous film 10 is to enhance the probability of nucleation occurring at these predetermined spaced apart locations. The formation of crystalline embryos at these locations, i.e., nucleation, is induced in the amorphous film 10 by a variety of different techniques, either singularly or in combination. Such techniques include the introduction of stress points by localized deformation or the introduction of hot points by localized heating or by a combination of such localized deformation and heating. Such techniques further include the dissolution and reprecipitation processes from solvents produced at the localized surface treatment points 14. The solvent is produced by placement of appropriate quantities of material, e.g., tin (Sn) on an amorphous silicon film, at these points 14, or by localized preferential vaporization at these points 14, e.g., arsenic preferential vaporization from GaAs from the amorphous film 10.

In the embodiment illustrated in FIG. 1, a plurality of styli 20 project downwardly from a plate 22 in which the styli 20 are gridlike mounted. By effecting relative motion between the plate 22 and a grid 24 supporting the substrate 12 and the amporphous film 10, the styli 20 prick the free surface 26 of the thin amorphous film 10, creating localized deformations therein, at the localized surface treatment points 14. These deformations, followed by heat treatment, cause the preferential formation of crystalline embryos at the locations of these surface treatment points 14. Since this nucleation step is effected in an environment heated by suitable heaters 28, the styli 20 are also at the same temperature as the film 10 and the substrate 12. Consequently, there is localized deformation occurring at an elevated temperature as the styli 20 prick the surface 26 of the film 10. Alternatively, the styli 20 are heated directly, resulting in a combination of localized heating and localized deformation occurring in the amorphous film 10 at these surface treatment points 14.

The illustrated surface treatment process takes place in a controlled atmosphere within one embodiment of an apparatus 30 that is continuously being flushed with an inert gas from a tank 32 having a valved connection 34 to the interior 36 of the apparatus 30. Apparatus 30 is also provided with a second valved connection 38 to the atmosphere to permit the escape of spent gases therefrom. Alternatively, an inert static atmosphere can be used. The reason for having a controlled atmosphere is lest the deposited thin amorphous film 10 degrades adversely, introducing defects and/or reducing thereby the performance characteristics of the resultant device. In addition to continuously flushing, with an inert gas, the interior 36 of the apparatus 30, the interior 36 is also maintained by the same inert gas at a pressure sufficiently high so as to avoid vaporization losses from occurring in the deposited amorphous film 10, where appropriate. This pressure, as is well known to those skilled in the art, must exceed the particular vapor pressure of the particular material being used for the amorphous film 10 at the respective temperatures employed during the deposition, surface treatment, nucleation and crystallization steps of the illustrated process.

The temperatures during the deposition, the localized surface treatment, and the nucleation steps of the process are selected to optimize the process. The temperatures are the same or they differ from one another, but are generally lower than that prevailing during the ensuing crystallization step. One exception is the deformation enhanced nucleation process, wherein surface treatment, nucleation and growth all occur at the same temperature. The selection of the operative temperatures is controlled by such variables as the thickness and the specific material of the deposited amorphous film 10, the thickness and the material of the substrate 12, the pressure prevailing within the interior 36 of the apparatus 30 and the particular deposition method employed. The selected temperatures must nevertheless be sufficiently low to prevent or at least inhibit spontaneous nucleation from occurring in the deposited amorphous film 10.

For silicon, we have found that the optimum deposition temperature is typically less than 350° C., although in some cases it may be as high as about 800° C. In all cases, the temperature must not exceed the temperature at which spontaneous nucleation and crystallization occur during deposition. The optimum deposition temperature is defined by weighing factors such as residual stress, film characteristics and frequency of uncontrolled nucleation events. The appropriate substrate temperature during the localized surface treatment step depends on the specific process which is being employed. For simple deformation enhanced nucleation, the temperature during deformation is not critical and can range from very low temperatures to about 350°-400° C. If nucleation is to be effected during the deformation step, an elevated temperature, typically 350° to about 550° C. is required. Depending on the deposition process used, some silicon films may require higher temperatures. If localized heating is used to effect nucleation, the average substrate temperature is not critical with respect to the nucleation step. The temperatures at the localized surface treatment points 14, however, will be high and can exceed the melting point over a small volume. Following the localized surface treatment step in the amorphous film 10, the temperature of the substrate 12 and of the film 10 is typically raised to a temperature level which is optimum for growth. For silicon films, this temperature is typically between about 550° C. to about 900° C. This temperature is selected to provide high mobilities and consequently high growth rates in the amorphous film 10 but still permit the existence of activation barriers in the amorphous film 10 so as to block spontaneous nucleation from occurring in the film 10 at places other than at the localized surface treatment points 14. This crystallization temperature, it will be observed, is relatively low compared to temperatures heretofore used in crystallization procedures and is, for each material, well below the melting point of the materials used for the amorphous film. The reason for this is twofold: first, it ensures that no further nucleation occurs anywhere else in the amorphous film 10 in addition to the crystalline embryos formed at the sites of the localized surface treatment points 14; and second, it allows the transition from the amorphous to the polycrystalline state to proceed without melting the material of the amorphous film 10.

The driving force for both the initial transformation from the amorphous to the polycrystalline state and the continued growth of crystalline grains into the remaining amorphous film 10 is the excess free energy of the amorphous state relative to the crystalline state. This driving force is substantially greater than that which causes conventional solid state grain growth. Unlike conventional grain growth, this excess free energy continues to force the growth of the crystalline state or phase independently of the grain size. Furthermore, the boundary between the crystalline embryos and the surrounding amorphous regions in the film 10 is fundamentally different from a grain boundary in a fully crystalline small-grain film. The former is apt to have a higher mobility. Consequently, this larger driving force combines with the higher mobility to achieve a much larger grain size than has heretofore been possible. In fact, grain growth of the crystalline embryos is only halted by their impingement on adjacently growing crystalline embryos. The resultant grain size of a polycrystalline film 40, as illustrated in FIG. 4, is thus effectively determined by the distances separating the localized surface treatment points 14 where the formation of crystalline embryos has been induced in the amorphous film 10, observe FIGS. 2 and 3. As is further evident from viewing FIG. 4, the resultant polycrystalline film 40 is characterized by a grain size 42 to film thickness 44 ratio that is greater than one. The ratio of grain size 42 to film thickness 44 is greater than two to one in the illustration of FIG. 4. In an instance where the film thickness 44 is about fifty microns and the distance separating the localized surface treatment points 14 is about two hundred microns, the ratio of the resultant grain size 42 (i.e., also about two hundred microns) to film thickness 44, is four to one. A photovoltaic device formed with such a grain size 42 to film thickness 44 ratio exhibits a conversion efficiency that approaches a value possessed by single crystals.

Figure 6:
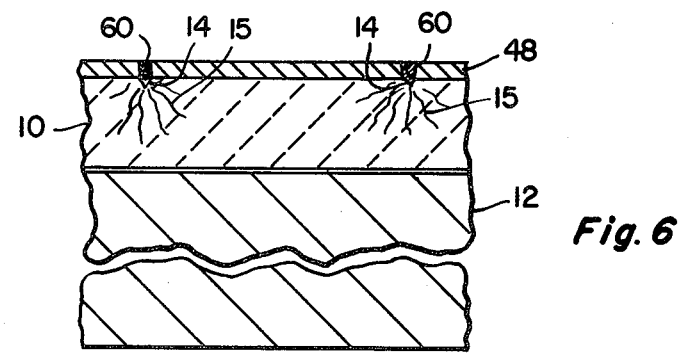
FIG. 6 is a cross-sectional view, on an enlarged scale, similar to that shown in FIG. 3 but also showing a photosensitive layer on the amorphous film.

FIG. 5 is a schematic illustration of a second embodiment of an apparatus 46 suitable for forming large-grain polycrystalline films 40 from thin amorphous films 10, also according to the invention. Apparatus 46 and the process practiced thereby differ from the first embodiment of the apparatus 30 shown in FIG. 1 in that a photosensitive layer 48 is also deposited from a source 50 on top of the thin amorphous film 10. The formation of crystalline embryos here is induced in the film 10 by rays 52 emanating from a conventional incandescent light souce 54 and passed by a mask 56 provided with a plurality of fine apertures 58. The rays 52 impinge on the photosensitive layer 48 and effect a photosensitive response at points 60 therein, observe FIG. 6. It is these photosensitive responses at points 60 that enhance nucleation at the localized surface treatment points 14 in the amorphous film 10, inducing thereby the formation of the crystalline embryos thereat. Photosensitive responses at points 60 include precipitation in the film as a result of the exposure, localized heating or explosive vaporization which transmit shock waves 15 in and to the amorphous film 10. Following the localized surface treatment step, the photosensitive layer 48 is removed from the amorphous film 10 by techniques known in the photographic art, preferably before the commencement of the crystallization step.

Figure 7:
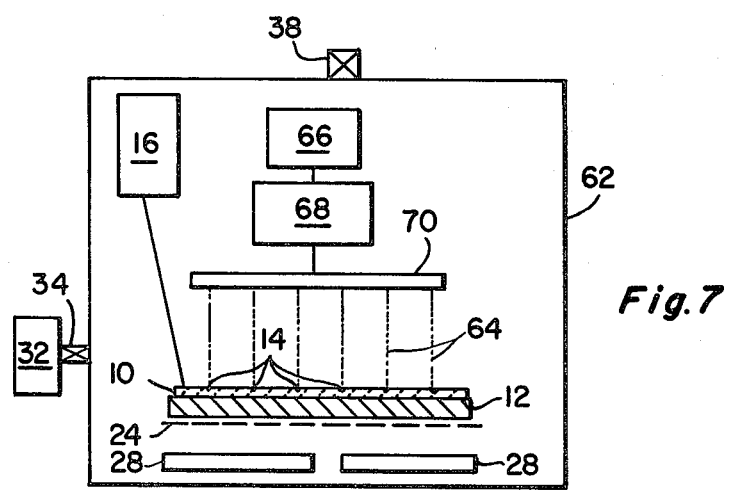
FIG. 7 is a schematic illustration of a third embodiment of an apparatus suitable for forming large-grain polycrystalline films from amorphous films, also according to the process of the invention.

FIG. 7 depicts a schematic illustration of a third embodiment of an apparatus 62 suitable for forming large-grain polycrystalline films 40 from thin amorphous films 10, also according to the process of the invention. In the process illustrated in FIG. 7, the formation of the crystalline embryos is induced in the amorphous film 10 by localized heating effected by pulsed radiation 64 striking the film 10 at the localized surface treatment points 14. The pulsed radiation 64 is originally emanating from a radiation source 66 which may either be pulsed itself or effectively pulsed by passing the radiation 64 through a shutter. The source 66 is either an arc, an incandescent source, a discharge lamp such as a xenon or sodium (Na) vapor lamp, or a laser which may be operated either in a pulsed or a continuous wave mode. Appropriate condenser and collimator optics 68 and a pointing element 70 combine to gather, direct and focus the pulsed radiation 64 so that it strikes the film 10 at the desired predetermined space apart locations to induce thereby the formation of the crystalline embryos at the localized surface treatment points 14. The surface treatment points 14, which are thus subjected to localized heating, can be heated one by one or simultaneously by using the mask 56 shown in FIG. 5.

Each of the above described embodiments involve batch processing. The process of the invention also lends itself to be practiced in a continuous process, as will now be described with reference to FIGS. 8 and 9.

FIG. 8 is a schematic illustration of a fourth embodiment of an apparatus 72 suitable for forming doped large-grain polycrystalline films from thin amorphous films in a continuous process. Apparatus 72 comprises a plurality of compartments 80, 82, 84 and 86 sealed from each other as well as from the ambient atmosphere, except for an appropriate ingress 74 and egress 76 and suitable ducts 78 formed between adjacent compartments. Each of the compartments 80, 82, 84 and 86 is provided with its own respective supply 88, 90, 92 and 94 of inert gas (such as helium, argon, hydrogen, nitrogen, etc., or mixture thereof) via a valved connection 96, 98, 100 and 102, respectively. Also, each of the compartments 80, 82, 84 and 86 is provided with temperature control represented by the heaters 104, 106, 108 and 110.

In the embodiment shown in FIG. 8, a continuous belt 112, trained over respective end rollers 114 and 116 and supported by a series of rollers 118, passes through each of these compartments 80, 82, 84 and 86 from the ingress 74 and via the ducts 78, through the egress 76. Continuous belt 112 carries a continuous substrate 120 through the compartments. In compartment 80, a first thin amorphous film 122 is deposited from an appropriate base reactant gas emanating from a source of supply 124. Appropriate base reactant gases include silicon hydride ($SiH_4$), known as silane, hydrogenated silicon chloride ($H_2SiCl_2$), trichlorosilane ($HSiCl_3$) and like gases. The film 122 can also be deposited from solid or liquid sources by sputtering or evaporation processes. A gas additive is added to the base reactant gas so as to incorporate therein either a p or an n type dopant element, respectively to form a junction in the thin amorphous film 122 as the same is being formed on the continuously moving substrate 120. An appropriate additive gas is diboron hexahydride ($B_2H_6$), known as diborane, for the dopant element boron, or phosphine ($PH_3$) for incorporating the dopant element phosphorus in the amorphous film 122. It is found that the dopant distribution introduced into the amorphous film 122 during its formation remains in place during the crystallization step. The thickness of the amorphous film 122 is controlled by the speed of travel of the continuous belt 112 and thus substrate 120, and by the richness of the base reactant gas.

A second thin amorphous film 126, appropriately doped relative to that of the first film 122, is formed in the compartment 82 on top of the first film 122 from a source of supply 128 of an appropriate mixture of a reactant gas with a gas additive. The combined amorphous films 122 and 126 are then subjected to localized surface treatment in compartment 84 by one of the procedures hereinabove described with reference to FIGS. 1, 5 and 7. Such a means 130 for localized surface treatment, by localized deformation or localized heating or their combination, at surface treatment points 132 enhances the formation of crystalline embryos at these points 132. As the surface treated combined amorphous films 122 and 126 enter the compartment 86, the films 122 and 126 are subjected to a somewhat elevated temperature to cause the crystalline embryos to grow into the remaining amorphous material. Added heating in the films 122 and 126 is effected by various appropriate means, such as a plurality of heating lamps 134 secured to a suitable reflector 136 mounted above the films 122 and 126. The temperatures in the compartments 80, 82, 84 and 86 are maintained at levels which are appropriate for the film material being processed and the specific requirements for the deposition, surface treatment, nucleation and growth steps in the overall process. These temperatures nevertheless remain below the melting point of the materials forming the amorphous films 122 and 126.

As shown in FIG. 9, the crystalline embryos start to grow, as at 138, under the influence of the excess free energy liberated in the combined films 122 and 126 during the transition from the amorphous to the crystalline state, aided by the higher grain boundary mobility, all as previously described. The growth of the crystalline embryos 138 proceeds in the combined amorphous films 122 and 126 until the further growth of the embryos 138 is halted when the individual, fully-grown grains 140 intersect one another in the now fully crystallized polycrystalline film 142. The film 142 and the continuous substrate 120 are then conveniently cut into the desired lengths of segments 144 by a suitable cutting implement 146 operatively mounted above the roller 116.

We have thus described an efficient process for forming large-grain polycrystalline films from amorphous films useful in the production of solid state devices, such as photovoltaic devices. The illustrated process combines a high deposition rate and the low costs of amorphous films with the high conversion efficiencies and durabilities of the resultant photovoltaics in one process, which process therefore satisfies the objects and advantages set forth above.

Since certain changes may be made in the present disclosure without departing from the scope of the invention involved herein, it is intended that all matter described in the foregoing specification or shown in the accompanying drawings be interpreted in an illustrative and not in a limiting sense.

What is claimed is:

1. A process for forming large grain polycrystalline films of random crystallographic orientation from amorphous films comprising:
   (a) depositing a thin amorphous film on a substrate in a controlled atmosphere;
   (b) inducing the formation of crystalline embryos at predetermined spaced apart locations in the free upper surface of said amorphous film by localized surface treatment thereat and inhibiting nucleation elsewhere in said film; and
   (c) allowing said crystalline embryos to grow in a controlled atmosphere and at a temperature below the melting point of said amorphous film with random crystallographic orientation by the excess free energy of said amorphous film, without further nucleation occurring in said amorphous film, until the growth of said embryos is halted by impingement on adjacently growing embryos, with the resultant grain size of said polycrystalline film being determined by the distances between said spaced apart locations and being greater than the thickness of said film, with transformation from said amorphous films to said large grain polycrystalline films being effected in a solid phase transition from the amorphous to the crystalline state.

2. A process for forming large grain polycrystalline films of random crystallographic orientation from amorphous films comprising:
   (a) depositing a thin amorphous film on a substrate in a controlled atmosphere;
   (b) inducing the formation of crystalline embryos at predetermined spaced apart locations in the free upper surface of said amorphous film by localized surface treatment thereat and inhibiting nucleation elsewhere in said film; and
   (c) allowing said crystalline embryos to grow with random crystallographic orientation by the excess free energy of said amorphous film, without further nucleation occurring in said amorphous film, until the growth of said embryos is halted by impingement on adjacently growing embryos, with the resultant grain size of said polycrystalline film being determined by the distances between said spaced apart locations and being greater than the thickness of said film;
   (d) said localized surface treatment comprising effecting localized deformations by a stylus pricking said free upper surface at said predetermined spaced apart locations in said amorphous film.

3. A process for forming large grain polycrystalline films of random crystallographic orientation from amorphous films comprising:
   (a) depositing a thin amorphous film on a substrate in a controlled atmosphere;
   (b) inducing the formation of crystalline embryos at predetermined spaced apart locations in the free upper surface of said amorphous film by localized surface treatment thereat and inhibiting nucleation elsewhere in said film; and
   (c) allowing said crystallographic orientation by the excess free energy of said amorphous film, without further nucleation occurring in said amorphous film, until the growth of said embryos is halted by impingement on adjacently growing embryos, with the resultant grain size of said polycrystalline film being determined by the distances between said spaced apart locations and being greater than the thickness of said film;
   (d) said localized surface treatment comprising effecting both localized deformation and localized heating by a heated stylus pricking said free upper surface at said predetermined spaced apart locations in said amorphous film.

4. A process for forming large-grain polycrystalline films from amorphous films comprising:
   (a) forming a thin amorphous film on a substrate;
   (b) depositing a photosensitive layer on said thin amorphous film;
   (c) inducing the formation of crystalline embryos at predetermined spaced apart locations in said amorphous film by impinging radiation on said photosensitive layer and inhibiting nucleation elsewhere in said film causing said crystalline embryos to grow, without further nucleation occurring in said amorphous film, until the growth of said embryos is halted by impingement on adjacently growing embryos.

5. A continuous process for forming doped large-grain polycrystalline films from amorphous films for use as photovoltaic devices comprising:
   (a) forming in a first controlled atmosphere a first thin doped amorphous film on a moving substrate;
   (b) forming in a second controlled atmosphere a second thin oppositely doped amorphous film on said first doped amorphous film;
   (c) inducing in a third controlled atmosphere the formation of crystalline embryos at predetermined spaced apart locations in said combined doped amorphous film and inhibiting nucleation elsewhere in said film; and
   (d) causing, in a fourth controlled atmosphere and at a temperature below the melting point of said combined doped amorphous film, said crystalline embryos to grow, without further nucleation occurring in said amorphous film, until the growth of said embryos is halted by impingement on adjacently growing embryos.

6. The continuous process of claim 5 wherein the force to drive the growth of said crystalline embryos is the excess free energy liberated in said combined doped amorphous film during the transition phase from the amorphous to the crystalline state and the resultant grain size of said doped large-grain polycrystalline films is greater than the thickness of said combined doped amorphous film.

7. The continuous process of claim 5 wherein said forming said doped large-grain polycrystalline films from said amorphous films is effected in a solid phase transition from the amorphous to the crystalline state and the resultant grain size of said doped large-grain polycrystalline films is determined by the distances between said predetermined spaced apart locations where said formation of said crystalline embryos is induced.

8. The continuous process of claim 5 wherein said inducing the formation of said crystalline embryos is effected by localized surface treatment in said combined doped amorphous film at said predetermined spaced apart locations.

9. The continuous process of claim 8 wherein said localized surface treatment comprises effecting localized deformations in said film.

10. The continuous process of claim 8 wherein said localized surface treatment comprises effecting localized heating in said film.

11. The continuous process of claim 8 wherein said localized surface treatment comprises effecting both localized deformations and localized heating in said film.

12. The continuous process of claim 8 wherein said localized surface treatment comprises effecting a reaction process in said film.

* * * * *